US012562338B2

(12) United States Patent
Breuer et al.

(10) Patent No.: US 12,562,338 B2
(45) Date of Patent: Feb. 24, 2026

(54) METHOD OF DETERMINING AN ENERGY SPECTRUM OR ENERGY WIDTH OF A CHARGED PARTICLE BEAM, AND CHARGED PARTICLE BEAM IMAGING DEVICE

(71) Applicant: ICT Integrated Circuit Testing Gesellschaft für Halbleiterprüftechnik mbH, Heimstetten (DE)

(72) Inventors: John Breuer, Munich (DE); Dominik Ehberger, Ebersberg (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 490 days.

(21) Appl. No.: 18/142,253

(22) Filed: May 2, 2023

(65) Prior Publication Data
US 2024/0371600 A1 Nov. 7, 2024

(51) Int. Cl.
*H01J 37/28* (2006.01)
*H01J 37/10* (2006.01)
*H01J 37/147* (2006.01)
*H01J 37/244* (2006.01)

(52) U.S. Cl.
CPC .............. *H01J 37/28* (2013.01); *H01J 37/10* (2013.01); *H01J 37/1471* (2013.01); *H01J 37/244* (2013.01); *H01J 2237/1506* (2013.01); *H01J 2237/1516* (2013.01); *H01J 2237/1526* (2013.01); *H01J 2237/20228* (2013.01); *H01J 2237/20235* (2013.01); *H01J 2237/223* (2013.01); *H01J 2237/282* (2013.01)

(58) Field of Classification Search
None
See application file for complete search history.

(56) References Cited

U.S. PATENT DOCUMENTS

| | | | |
|---|---|---|---|
| 2006/0016992 A1* | 1/2006 | Sato ...................... | H01J 37/153 |
| | | | 250/311 |
| 2007/0181805 A1* | 8/2007 | Mori ...................... | H01J 37/28 |
| | | | 250/310 |

* cited by examiner

*Primary Examiner* — Andrew Smyth
(74) *Attorney, Agent, or Firm* — Kilpatrick Townsend & Stockton LLP

(57) ABSTRACT

A method of determining an energy spectrum or energy width of a charged particle beam (11) focused by a focusing lens (120) toward a sample plane ($p_S$) in a charged particle beam imaging device is described. The method includes (a) introducing an energy-dependent deflection of the charged particle beam (11) that leads to a spot broadening along a dispersion axis in the sample plane ($p_S$), and taking an image of a sample (10) arranged in the sample plane using the charged particle beam; (b) retrieving a beam profile of the charged particle beam from the image; and (c) determining the energy spectrum or energy width from the beam profile. Further embodiments described herein relate to a charged particle beam imaging device configured to determine the energy spectrum or energy width of a charged particle beam, particularly according to any of the methods described herein.

20 Claims, 3 Drawing Sheets

METHOD OF DETERMINING AN ENERGY SPECTRUM OR ENERGY WIDTH OF A CHARGED PARTICLE BEAM, AND CHARGED PARTICLE BEAM IMAGING DEVICE

TECHNICAL FIELD

Embodiments described herein relate to methods of determining the energy spectrum or the energy width of a charged particle beam, particularly an electron beam, generated by a source of charged particles, for example, in an electron microscope, particularly in a scanning electron microscope (SEM). Specifically, the energy spectrum or the energy width of a charged particle beam in a charged particle beam imaging device is determined. Further described are charged particle beam imaging devices configured for carrying out the described methods.

BACKGROUND

Modern semiconductor technology has created a high demand for structuring and probing specimens in the nanometer or even in the sub-nanometer scale. Micrometer and nanometer-scale process control, inspection or structuring is often done with charged particle beams, e.g. electron beams, which are generated, shaped, deflected and focused in charged particle beam imaging devices, such as electron microscopes or electron beam pattern generators. For inspection purposes, charged particle beams offer a superior spatial resolution compared to, e.g., photon beams.

Inspection apparatuses using charged particle beams, such as scanning electron microscopes (SEM), have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an electron microscope, the primary electron beam generates signal particles such as secondary electrons (SE) and/or backscattered electrons (BSE) upon impingement on a sample that can be used to image and/or inspect the sample.

Charged particle beam imaging devices have a beam source, e.g., an electron source, for generating the charged particle beam that is used for sample inspection and/or imaging, an objective lens for focusing the charged particle beam on the sample, as well as a detector for detecting the signal particles emitted by the sample.

The spectrum of the charged particle beam is a key parameter of a charged particle beam imaging system that also affects, for example, the resolution of the system, because a charged particle beam with a broad energy width generally suffers more strongly from chromatic aberrations than a charged particle beam with a narrow spectrum and cannot generally be focused to such a small spot. For obtaining high-resolution images, the spectrum of the charged particle beam typically has a narrow width in the range of few electron volts or less. The energy width of the charged particle beam depends on the operating conditions of the beam emitter and on various other parameters and device settings, and variations of the emitter parameters are typically one of the largest uncertainties of charged particle beam devices.

The energy spectrum of charged particle beams can be measured with a spectrometer that introduces dispersion, whereupon the dispersed beam can be examined with a spectrometer detector. Different types of spectrometers are known, such as, for example, retarding field spectrometers, spectrometers using a magnetic prism, and others.

However, a spectrometer typically requires additional beam-optical components, such as additional beam alignment and beam steering devices, spectrometer detectors, filters and/or prisms. Further, a special measurement configuration with a specific beam path is generally used for measuring a beam spectrum in a spectrometer. For example, the beam is deflected away from a regular beam path into the spectrometer, and/or the beam is aligned in relation to the beam-optical components of the spectrometer and the spectrometer detector, which may be time-consuming. Further, aberrations and alignment accuracy of the spectrometer may negatively affect the resulting energy resolution of the determined energy spectrum. For the above reasons, the use of a spectrometer for determining the energy spectrum of charged particle beams may not always be practical for routine measurements and tool-to-tool comparison.

In view of the above, it would be beneficial to provide methods for quickly and reliably determining the energy spectrum of a charged particle beam, as well as to provide charged particle beam imaging devices configured to carry out such methods, particularly without a need for extensive additional alignment and additional beam-optical components.

SUMMARY

In light of the above, methods of determining the energy spectrum or energy width of a charged particle beam and charged particle beam imaging devices configured to carry out such methods are provided according to the independent claims.

According to a first aspect, a method of determining an energy spectrum or energy width of a charged particle beam is provided, wherein the charged particle beam is focused with a focusing lens toward a sample plane. The method includes:

(a) introducing an energy-dependent deflection of the charged particle beam that leads to a spot broadening along a dispersion axis in the sample plane, and taking an image of a sample arranged in the sample plane using the charged particle beam;

(b) retrieving a beam profile of the charged particle beam from the image; and (c) determining the energy spectrum from the beam profile.

According to a second aspect, a charged particle beam imaging device configured to determine an energy spectrum or energy width of a charged particle beam is provided. The charged particle beam imaging device may include a source for emitting the charged particle beam, particularly an electron beam source; a sample stage; a focusing lens for focusing the charged particle beam toward a sample placed on the sample stage in a sample plane, wherein a dispersive element or mechanism is provided for introducing an energy-dependent deflection of the charged particle beam that leads to a spot broadening along a dispersion axis in the sample plane; a charged particle detector for detecting signal particles emitted from the sample; and a processor and a memory storing instructions that, when executed by the processor, cause the charged particle beam imaging device to retrieve a beam profile of the charged particle beam from an image of the sample taken when the charged particle beam is influenced by the dispersive element or mechanism; and to determine the energy spectrum of the charged particle beam from the beam profile. The charged particle beam imaging device may be configured to carry out any of the methods described herein.

Embodiments are also directed at apparatuses for carrying out the disclosed methods and include apparatus parts for performing the individual method actions. The methods may be performed by way of hardware parts, a computer programmed by appropriate software, by any combination of the two or in any other manner. Furthermore, embodiments are also directed at methods of operating the described apparatuses. Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

FIGS. 3D and 3E show a high-resolution image of a sample and a beam profile retrieved therefrom;

FIG. 3F shows an example of a relation between particle energy and deflection distance along a dispersion axis as caused by an energy-dependent deflection.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

According to embodiments described herein, a method of determining the energy spectrum and/or the energy width of a charged particle beam in a charged particle beam imaging device is provided. The method is accurate, because the spectrum of the charged particle beam can be determined in-situ based on one or more actual images of a sample taken by the device, utilizing an actual device setup and device beam path. Further, there may not be a need for a specific spectrometer 10) detector, for additional beam-optical components, and/or for extensive alignment of a specific measurement beam path for determining the energy spectrum.

Figure 1:
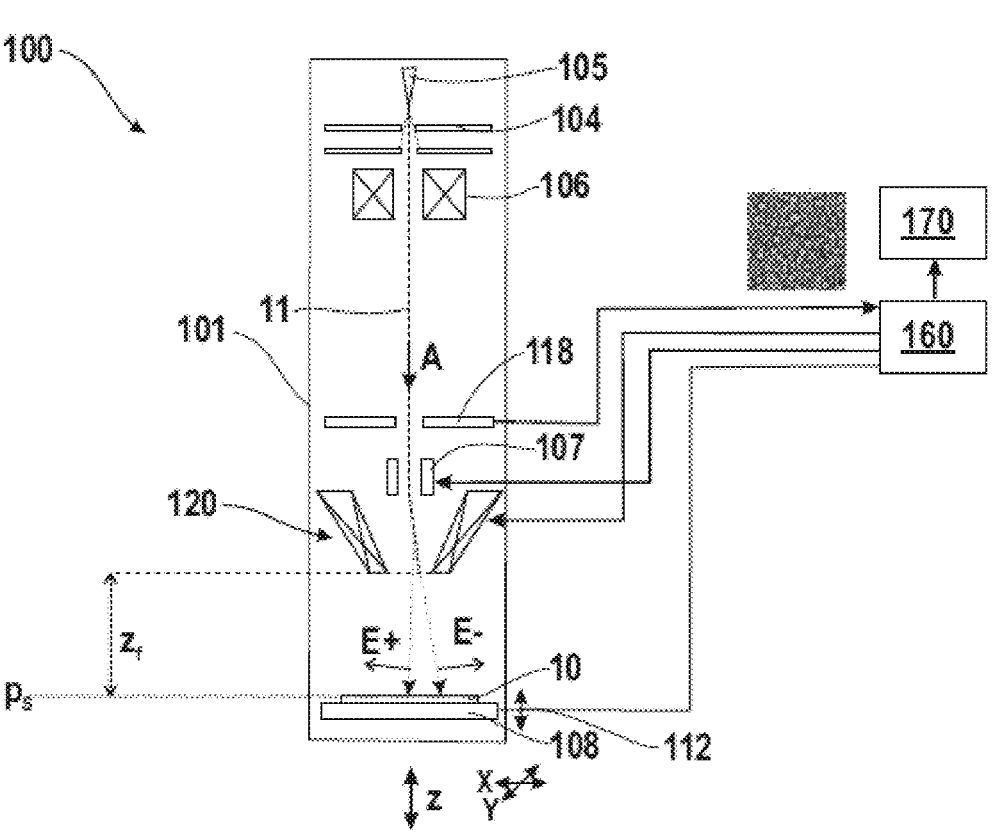
FIG. 1 shows a schematic view of a charged particle beam imaging device according to embodiments described herein that is configured to carry out any of the methods described herein.

FIG. 1 is a schematic view of a charged particle beam imaging device 100 configured to carry out a method of determining the energy spectrum described herein.

The charged particle beam imaging device 100 of FIG. 1 is configured for inspecting and/or imaging a sample 10 and includes a charged particle source 105, particularly an electron source with an emission tip, for emitting a charged particle beam 11, particularly an electron beam, propagating along an optical axis A. The charged particle beam imaging device 100 further includes a sample stage 108 and a focusing lens 120, particularly an objective lens, for focusing the charged particle 20) beam 11 toward the sample 10 that is placed on the sample stage 108 in a sample plane ($p_S$). The sample plane ($p_S$) may be a plane in which the sample 10 to be inspected can be placed that extends substantially perpendicular to the optical axis A. For taking an image, the charged particle beam is focused toward the sample plane, particularly toward an upper surface of the sample 10 that is to be inspected.

The charged particle beam imaging device 100 further includes a charged particle detector 118, particularly an electron detector, for detecting signal particles (e.g., secondary electrons and/or backscattered electrons) emitted from the sample 10. An image generation unit 160 may be provided that generates one or more images of the sample 10 based on a charged particle signal received from the charged particle detector 118. The image generation unit 160 can forward the one or more images of the sample to a processor 170, e.g., a computer, that may be configured to determine the energy spectrum of the charged particle beam 11 in accordance with any of the methods described herein.

Specifically, the processor 170 may include a processor and a memory storing instructions that, when executed by the processor, cause the charged particle beam imaging device 100 to determine the energy spectrum and/or the energy width of the charged particle beam according to any of the methods described herein.

The sample stage 108 may be a movable stage. In particular, the sample stage 108 may be movable in a Z-direction (as is illustrated by arrow 112 in FIG. 1), i.e., in a direction along the optical axis A, such that the distance between the focusing lens 120 and the sample stage 108 can be varied. By moving the sample stage 108 in the Z-direction, the sample 10 can be moved to different defocus distances away from a focal plane of the focusing lens 120, such that "out-of-focus images" (or "defocus images") of the sample 10 can be taken by a respective stage movement away from the beam focus. In some embodiments, the sample stage 108 may also be movable in a plane perpendicular to the optical axis A (also referred to herein as the X-Y-plane). By moving the sample stage 108 in the X-Y-plane, a predetermined surface region of the sample 10 can be moved into an area below the focusing lens 120, such that the predetermined surface region can be imaged or inspected by focusing the charged particle beam 11 thereon.

The beam-optical components of the charged particle beam imaging device 100 are typically placed in a vacuum chamber 101 that can be evacuated, such that the charged particle beam 11 can propagate along the optical axis A from the charged particle source 105 toward the sample stage 108 and hit the sample 10 at a sub-atmospheric pressure, for example, a pressure below $10^{-3}$ mbar, a pressure below $10^{-5}$ mbar, or a pressure below $10^{-8}$ mbar.

In some embodiments, the charged particle beam imaging device 100 may be an electron microscope, particularly a scanning electron microscope. A scan deflector may be provided for scanning the charged particle beam 11 over a surface of the sample 10 along a predetermined scanning pattern, e.g., in the X-direction and/or in the Y-direction.

In some embodiments, a condenser lens system 106 (including one or more condenser lenses) may be arranged downstream of the charged particle source 105, particularly for collimating the charged particle beam 11 propagating toward the focusing lens 120. In some embodiments, the focusing lens 120 is an objective lens configured to focus the charged particle beam 11 on the sample 10, particularly a magnetic objective lens, an electrostatic objective lens, or a combined magnetic-electrostatic objective lens.

In some embodiments, an extractor electrode 104 may be arranged downstream of the charged particle source 105 and configured to extract the charged particle beam for propagation along the optical axis A by applying an extractor potential to the extractor electrode 104. Specifically, a beam acceleration potential, particularly a positive potential difference relative to the emission tip of the charged particle source 105, may be applied to the extractor electrode 104 for accelerating the charged particles, particularly the electrons, toward and through an opening of the extractor electrode 104. A main (or center) beam energy of the charged particle beam can, for example, be varied by varying the tip voltage or source potential of the charged particle source. In some embodiments, the charged particle source 105 may be a cold field emitter (CFE), a thermal field emitter (TFE), or a Schottky emitter.

One or more surface regions of the sample 10 can be inspected and/or imaged with the charged particle beam imaging device 100. The term "sample" as used herein may relate to a substrate, e.g., with one or more layers or features formed thereon, a semiconductor wafer, a glass substrate, a web substrate, or another sample or specimen that is to be inspected. The sample can be inspected 30) for one or more of imaging a surface of the sample, measuring dimensions of one or more features of the sample, e.g. in a lateral direction, i.e. in the X-Y-plane, conducting critical dimension measurements and/or metrology, detecting defects, and/or investigating the quality of the sample.

For inspecting the sample 10 with the charged particle beam 11, the charged particle beam 11 is typically focused on the sample surface with the focusing lens 120. Secondary electrons and/or backscattered electrons (referred to as "signal electrons") are emitted from the sample when the charged particle beam 11 impinges on the sample surface. The signal electrons provide information about spatial characteristics and dimensions of features of the sample and can be detected with the charged particle detector 118. By scanning the charged particle beam 11 over the sample surface, e.g. with a scan deflector, and detecting the signal electrons as a function of the generation position of the signal electrons, the sample surface or a portion thereof can be imaged, e.g., with the image generation unit 160 that may be configured to provide an image of the sample 10 based on the received signal electrons.

A small spot size of the focused charged particle beam 11 on the sample surface generally increases the image resolution. Accordingly, during actual sample inspection, the settings of the device are generally such that the sample surface is arranged substantially in the focal plane of the focusing lens 120, and chromatic and spatial aberrations of the charged particle beam are kept small, in order to obtain a high-resolution image of the sample 10. An image of the sample 10 taken at such device settings is also referred to herein as a "high-resolution image" or a "focus image $h_f$". The beam profile of the charged particle beam 11 used for taking a high-resolution image of a sample may also be referred to as a "focus beam profile $g_f$". FIGS. 3D and 3E show examples of a high-resolution image ($h_f$) and of a focus beam profile ($g_f$) of the charged particle beam.

An image can be mathematically presented in real space (=in the image domain, i.e. as a function of the spatial coordinates) or in Fourier space (=in the frequency domain, i.e. as a function of spatial frequency). An image in Fourier space 30) can be calculated from an image in real space via a Fourier transformation (FT). Both above representations contain corresponding information of the image. As used herein, images in real space are designated with the small letter "$h_n$," and images in Fourier space are designated by the capital letter "$H_n$". Similarly, beam profiles in real space are designated herein with the small letter "$g_n$," and beam profiles in Fourier space are designated herein by the capital letter "$G_n$". Images and beam profiles in real space can be Fourier transformed into Fourier space, and vice versa, via Fourier transformation, e.g., via a fast Fourier transform (FFT) algorithm.

Figure 2:
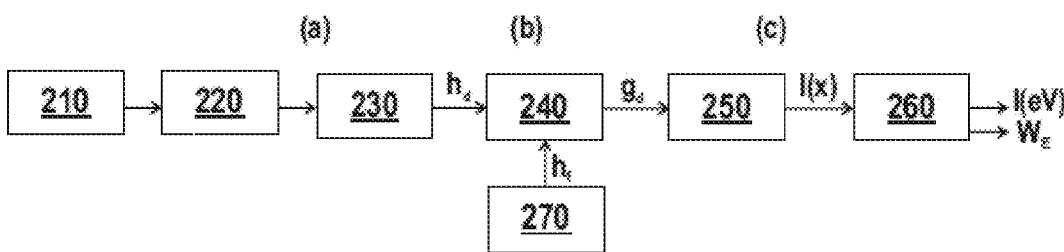
FIG. 2 shows a schematic flow diagram illustrating a method of determining an energy spectrum of a charged particle beam according to embodiments described herein.

FIG. 2 schematically illustrates a method of determining the energy spectrum (I(eV)) of a charged particle beam focused with the focusing lens toward a sample plane ($p_S$) in a charged particle beam imaging device, e.g., in the charged particle beam imaging device 100 of FIG. 1.

In operation 210 of FIG. 2, an energy-dependent deflection of the charged particle beam (i.e., a dispersion) is introduced that leads to a spot broadening in the sample plane ($p_S$) along a dispersion axis. An "energy-dependent deflection" as used herein refers to a deflection of the charged particles of the charged particle beam that is particle-energy dependent and that leads to an energy-dependent beam shift in the sample plane. Specifically, high-energy particles may be deflected differently (e.g., by a lower deflection angle) than low-energy particles of the charged particle beam. Since charged particle beams have a finite energy width ("WE" larger zero), an energy-dependent deflection generally leads to a spatial broadening of the charged particle beam downstream of a dispersive element or the dispersive mechanism.

In the embodiments described herein, the energy-dependent deflection is introduced such that the beam spot of the charged particle beam focused by the focusing lens toward the sample plane is broadened in the sample plane along a broadening axis, and the broadening axis along which the dispersion-caused spot broadening occurs is referred to herein as a "dispersion axis". For example, in the embodiment of FIG. 1, the beam spot in the sample plane ($p_S$) is broadened along the X-axis, since high-energy beam particles (E+) and low-energy beam particles (E−) are deflected by different angles along the X-axis, such that the X-axis corresponds to the dispersion axis in the example depicted in FIG. 1.

The energy-dependent deflection may be introduced in an arbitrary way, particularly by a dispersive element or by a dispersive mechanism, i.e. a mechanism that introduces dispersion. For example, the dispersive element may be a beam deflector or a prism that introduces an energy-dependent deflection. Generally, beam deflectors introduce dispersion since the deflection angle of a beam deflector typically depends on the charged particle energy (according to the "Lorentz force" that is energy-dependent). Hence, any deflector can in principle be used for introducing an energy-dependent deflection causing a "chromatic" spot broadening in the sample plane.

In some embodiments, the energy-dependent deflection is introduced by steering the charged particle beam off-axially through the focusing lens, e.g., with a beam deflector 107 arranged upstream of the focusing lens 120, as is schematically depicted in FIG. 1. For example, the beam path through the focusing lens 120 may be misaligned (e.g., tilted) on purpose by deflecting the charged particle beam away from the optical axis A that centrally intersects through the focusing lens 120. In particular, the beam path through the focusing lens 120 may be tilted, e.g. by deflecting the charged particle beam with a beam deflector 107 upstream of the 20) focusing lens away from the optical axis A. The beam deflector 107 may anyway be present in the device, such that no additional component may be needed.

Misaligning the beam path through the objective lens with a beam deflector 107 has the advantage that no further beam-optical components, such as a prism, are needed for introducing the dispersion. Alternatively, a dispersive beam-optical component, such as a magnetic prism or an additional deflector, may be used for introducing the dispersion. The dispersion may be introduced along the beam path through the focusing lens, causing a beam broadening in the sample plane, such that no specific configuration or alignment may be needed for the determination of the energy spectrum. In particular, the energy spectrum can be determined "in-situ" by taking a sample image with the device, particularly using a misaligned and hence dispersed beam.

In some embodiments, the energy-dependent deflection may be provided by deflecting the beam off an optical axis of the device, for example by slightly misaligning the charged particle beam with a beam deflector.

In operation 230 of FIG. 2, an image (ha) of the sample arranged in the sample plane ($p_S$) is taken using the dispersed charged particle beam. For example, after introducing the energy-dependent deflection, the charged particle beam is scanned over the sample for taking an image of the sample.

Figures 3A, 3B, 3C:
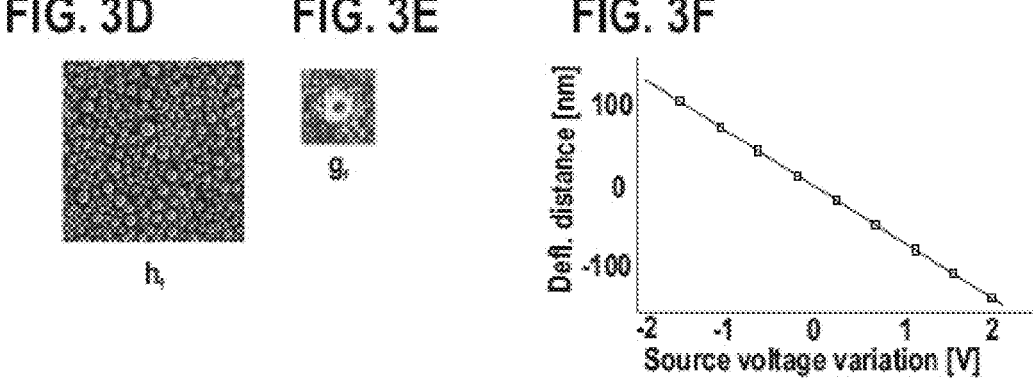
FIG. 3A shows an example of an image of a sample taken with a dispersed beam according to the methods described herein.
FIG. 3B shows a beam profile of a dispersed charged particle beam retrieved from the image of FIG. 3A.
FIG. 3C shows an example of an energy spectrum of a charged particle beam determined according to any of the methods described herein.

In some embodiments, the sample plane may substantially correspond to the focal plane of the focusing lens. Due to the spot broadening in the sample plane ($p_S$) caused by the introduced dispersion, the image has a reduced resolution and may be "chromatically blurred", as it is illustrated in FIG. 3A that shows an image ($h_d$) of a sample taken with a dispersed charged particle beam. FIG. 3D shows a high-resolution image ($h_f$) of the sample taken in the focal plane of the focusing lens without the energy-dependent deflection of the beam. A comparison of the images of FIGS. 3A and 3D shows that the image ($h_d$) taken with the dispersed charged particle beam in operation 210 is blurred relative to a high-resolution image ($h_f$) taken without the introduced dispersion.

In operation 240 of FIG. 2, a beam profile ($g_d$) of the charged particle beam is retrieved from the image ($h_d$) taken in operation 230. In some implementations, the beam profile ($g_d$) is retrieved from the image ($h_d$) based on a deconvolution, particularly a deconvolution with a high-resolution image ($h_f$) of the sample (since $h_d \approx h_f \times g_d$). In some embodiments, retrieving the beam profile from the image may include dividing the image taken in operation 230 in Fourier space (Ha) by a high-resolution image ($H_f$) of the sample in Fourier space. Such a division in Fourier space can be considered equivalent to a deconvolution. In particular, a deconvolution of the image ($h_d$) with the high-resolution image ($h_f$) can be calculated in Fourier space by dividing the Fourier transforms ($H_d$) and ($H_f$) through each other. Specifically, a deconvolution can generally be calculated in Fourier space based on a division of the respective Fourier transforms, followed by taking the inverse Fourier transform.

A "high-resolution image" may be understood as an image of the sample that has a higher resolution than the image that is deconvolved using the high-resolution image or that is divided in Fourier space by the high-resolution image for obtaining the respective beam profile. For example, the resolution of the high-resolution image may be improved by at least 20% or by at least 50% relative to the resolution of the image whose beam profile is to be retrieved. In some embodiments, which can be combined with other embodiments described herein, the high-resolution image ($h_f$) of the sample is taken with the charged particle beam imaging device when the sample is arranged at the beam focus of the charged particle beam, particularly with a device setting configured to provide high-resolution images, e.g., without the purposefully introduced dispersion, particularly with a diffraction limited focal spot on the sample. Alternatively, the high-resolution image of the sample may be available otherwise, e.g., because details of the sample surface are already known in advance or because a known sample is used for the determination of the energy spectrum.

The above beam profile extraction method is based on the fact that dividing a taken image of a sample by a high-resolution image of the sample in Fourier space, which is equivalent to a deconvolution of the taken image by the high-resolution image in real space, removes the structure of the sample from the image, such that said division or deconvolution can yield the pure beam profile, i.e. the beam cross section without sample information.

In some embodiments, which can be combined with other embodiments described herein, the method includes, as is illustrated by operation 270 in FIG. 2, taking a high-resolution image ($h_f$) of the sample, particularly without introducing the energy-dependent deflection, at a second resolution that is higher than a first resolution of the image taken in operation 230. As mentioned above, the beam profile ($g_d$) in operation 240 can be retrieved by deconvolving the image (ha) with the high-resolution image ($h_f$) of the sample, or by a division in Fourier space.

A high-resolution image ($h_f$) of the sample is schematically illustrated in FIG. 3D. The high-resolution image ($h_f$) can be taken with the charged particle beam imaging device at a different setting that is adapted for generating high-resolution images. In particular, for obtaining the high-resolution image of the sample, the device settings may be such as to provide a high-resolution image, e.g., by steering the charged particle beam along the optical axis A through the focusing lens for avoiding or reducing dispersion-cause spot broadening, particularly by providing a diffraction-limited spot size. A diffraction-limited spot size can typically be obtained with a low-current charged particle beam focused with a large numerical aperture by the objective lens on the sample. Alternatively, the high-resolution image ($h_f$) of the sample can be available otherwise, e.g., because details of the sample are already known in advance.

The beam profile ($g_d$) retrieved in operation 240 can be used for determining the energy spectrum (I(eV)) of the charged particle beam. For example, in operation 250 of FIG. 2, determining the energy spectrum from the beam profile ($g_d$) includes taking a radial line profile I(x) through the beam profile ($g_d$) along the dispersion axis ($X_d$).

Operation 250 is illustrated in FIG. 3B in further detail. FIG. 3B shows the beam profile $(g_d)$ retrieved from the image $(h_d)$, wherein the beam profile has a characteristic beam broadening along the dispersion axis $(X_d)$ that is caused by the introduced energy-dependent deflection. The intensity variation of the beam profile along the dispersion axis $(X_d)$ through the center of the beam profile may correspond to the radial line profile I(x) taken in operation 250.

Determining the energy spectrum (I(eV)) from the beam profile may further include, as illustrated by operation 260 of FIG. 2, converting a deflection distance (in spatial units, such as [nm], or a deflection angle in [degrees]) along the dispersion axis $(X_d)$ to energy units (such as [eV]). The radial line profile can be output or presented in dependency of the energy units to yield the energy spectrum (I(eV)) that is schematically depicted in FIG. 3C. The energy spectrum is generally centered around a main (or center) particle energy $E_0$ of the charged particle beam. In particular, the x-axis unit of the energy spectrum may be particle energy (e.g., [eV]) relative to a center particle energy $E_0$ (see FIG. 3C).

In some embodiments, which can be combined with other embodiments described herein, the energy spectrum can be determined from the beam profile $(g_d)$ as follows: A (first) radial line profile is taken through the beam profile along the dispersion axis as explained above, and a (second) radial line profile is taken through the beam profile along a second axis transverse to the dispersion axis, particularly orthogonal to the dispersion axis. The energy spectrum can then be calculated using both the (first) radial line profile and the (second) radial line profile.

In particular, the energy spectrum can be calculated based on the first and second radial line profiles based on a deconvolution, particularly by deconvolving the first radial line profile (i.e., the radial line profile along the dispersion axis) with the second radial line profile (that may not include dispersion or spatial energy dependency). Also here, the determination of the energy spectrum may further include converting or expressing the x-axis units in energy units, particularly in [eV].

A determination of the energy spectrum based on not only the first radial line profile (=along the dispersion axis), but also on a second radial line profile (=transverse to the dispersion axis) may be beneficial and yield a more accurate result, particularly if the introduced dispersion is not very strong, i.e., if the spot along the dispersion axis is not much broader than along the undispersed axis perpendicular thereto. Further, filter terms used in the retrieval of the beam profile drop out and to not influence the determined energy spectrum. On the other hand, a determination of the energy spectrum based on (only) the radial line profile along the dispersion axis may be easier and less computation-intensive and may be particularly suitable, if the spot shape is considerably asymmetric due to the introduced dispersion.

Charged particle beams in charged particle beam imaging apparatuses may have a narrow-width energy spectrum centered around a main particle energy $E_0$ of the charged particle beam (typically referred to as the "beam energy"). For example, the energy width may be 5 eV or less, particularly 2 eV or less, or even 1 eV or less. The energy width WE of the charged particle beam can be retrieved from the energy spectrum (I(eV)), for example, as a FWHM-value, a FW50-value, a $1/e^2$-width, or another commonly used magnitude that describes a beam width parameter. The energy width WE of the charged particle beam can also be taken directly from the radial line profile of the beam profile, based on a conversion factor between the distance along the dispersion axis and energy units.

In some embodiments, the dependency between particle energy (or deviation of the particle energy from the main particle energy of the beam) and deflection strength caused by the energy-dependent deflection can be determined in a preceding operation. In particular, the dependency between a deflection distance of a charged particle along the dispersion axis caused by the introduced energy-dependent deflection and the particle energy can be determined in a preceding calibration operation. If the energy dependency of the introduced energy-dependent deflection is known, the deflection distance can be easily and quickly converted to energy units in operation 260.

For example, a calibration can be carried out in a preceding operation as follows: A predetermined energy-dependent deflection can be applied, and the main energy $E_0$ of the charged particle beam can be varied, e.g., by varying a tip voltage or source potential V of the beam emitter, while monitoring a deflection distance of the spot center in the sample plane that is caused by the energy-dependent deflection. The dependency between the beam main energy variation and the deflection distance may be linear (e.g., if the energy-dependent deflection is introduced by an off-axis beam path through the focusing lens caused by a deflection), as is schematically depicted in FIG. 3F. FIG. 3F shows an example of a relation between particle energy and deflection distance along a dispersion axis as caused by a (linear) energy-dependent deflection. After determining the above dependency or calibration factor, the conversion of the deflection distance along the dispersion axis to energy units in operation 260 may be a simple multiplication of spatial units (for example, expressed in [nm]) with a calibration factor to yield energy units (for example, in [electron volts], [eV]).

The determination of the energy spectrum or of the energy width of a charged particle beam as described herein can be implemented on any charged particle imaging tool and can be used to record variations in the emitter's energy spectrum, e.g. in-situ. Monitoring variations of the energy spectrum may be relevant, for example, for matching.

After the determination of the energy spectrum according to the method described herein, the operating conditions and/or the device settings of the charged particle beam imaging device or of beam-optical components can optionally be changed or modified based on the determined energy spectrum, e.g. for modifying or tailoring the energy spectrum in a predetermined manner. In-situ matching of the energy spectrum may be possible. For example, the emitter temperature (e.g., the heater current for a thermal field emitter) or the extraction voltage or extraction field can be varied for changing the emission characteristics. Since the energy spectrum is affected by the Coulomb interactions in the immediate vicinity of the emission tip, where the energies are low and the currents are high, a change in the emission current or field or a change in other source parameters, such as the emitter temperature, can affect the energy spectrum of the generated charged particle beam. Device settings may refer to the beam emitter, the focusing lens, the condenser lens, and/or aberration correctors. Accordingly, the determined energy spectrum can be provided as a feedback for modifying the operating conditions of the device, e.g., for tailoring the energy spectrum (keyword "matching").

Further, the methods described herein are beneficial for the following reasons: The energy spectrum or energy width can in principle be measured in any charged particle beam column according to the described methods, since no specific tools or samples may be needed. The energy spectrum can be measured directly in the image plane where the spectrum contributes to the beam profile, i.e., to the spot shape. Emitter variations can be analyzed and/or monitored in-situ. A full modelling of the charged particle beam can be possible, particularly, if also the numerical aperture (NA), the beam aberrations and/or the brightness of the charged particle beam are measured, particularly in-situ based on one or more images (focus images and/or defocus images) of a sample taken with the charged particle beam.

As is schematically depicted by operation 220 of FIG. 2, the method may optionally include correcting at least one beam aberration of the charged particle beam after introducing the energy-dependent deflection and before taking the image with the dispersed charged particle beam. The dispersive mechanism or element (e.g., a steering of the charged particle beam off-axially through the objective lens) may not only introduce an energy-dependent deflection, but also one or more (other) beam aberrations that could also contribute to the spot shape of the charged particle beam in the sample plane and negatively affect the accuracy of the determined energy spectrum. Therefore, a correction of one or more beam aberrations, particularly of beam aberrations caused by the introduced dispersion such as astigmatism, may be beneficial before the image is taken in operation 230 of FIG. 2.

In some embodiments, the astigmatism of the charged particle beam is corrected before the image is taken, particularly with one or more beam aberration correctors, such as one or more stigmators, magnetic multipoles and/or electrostatic multipoles. For example, the steering of the beam path through the focusing lens on an off-axis beam path may cause astigmatism of the charged particle beam whose compensation is beneficial for being able to obtain a more accurate energy spectrum in the sample plane.

An actual amount of astigmatism and/or an amount of one or more other beam aberrations may be determined based on one or more beam profiles retrieved from one or more taken images. In particular, one or more defocus beam profiles (e.g., if taken on both opposite sides of a beam focus) may include information on aberrations of the charged particle beam, such that aberration coefficients can be extracted or calculated based on one or more defocus beam profiles of the charged particle beam.

In some embodiments, which can be combined with other embodiments described herein, an actual amount of at least one beam aberration, particularly an actual amount of astigmatism of the charged particle beam, is determined by taking one or more defocus images of the sample at one or more defocus settings, and by retrieving one or more defocus beam profiles from the one or more defocus images, e.g., based on a deconvolution with a high-resolution image or based on a division in Fourier space, as explained above.

In some implementations, the one or more defocus images of the sample are taken with the charged particle beam imaging device when the sample is arranged at one or more defocus distances from a beam focus of the charged particle beam, i.e., when the sample is arranged "out-of-focus". For example, the one or more defocus distances can be provided by varying the focusing strength of the focusing lens 120 for shifting the focal plane of the focusing lens relative to the sample plane and/or by shifting the sample along the z-axis, e.g. via a z-movement of the sample stage 108. For example, one or more overfocus beam profiles can be retrieved from one or more overfocus images, and one or more underfocus beam profiles can be retrieved from one or more underfocus images, and the actual amount of at least one beam aberration coefficient can be extracted from the one or more overfocus and underfocus beam profiles.

In some embodiments, a retrieved value of at least one aberration characteristic that is related to the at least one beam aberration is retrieved from the one or more defocus beam profiles, and the actual amount of the at least one beam aberration is determined based on the retrieved value of the aberration characteristic and based on a predetermined dependency between the at least one beam aberration and the at least one beam aberration characteristic. An "aberration characteristic" is a parameter that has a predetermined (known or determinable) relation with respect to the at least one beam aberration coefficient and can be extracted from the one or more defocus beam profiles (e.g., by measuring the width and/or the symmetry or asymmetry of the one or more defocus beam profiles). In some embodiments, the aberration characteristic may be stored in a memory of the charged particle beam imaging system, such that, once an actual value of the aberration characteristic has been extracted from the one or more defocus beam profiles, the actual value of the at least one beam aberration (e.g., the value of the respective beam aberration coefficient) can be directly taken using the known aberration characteristic. The beam aberration coefficient whose actual value is known can then be corrected with the one or more aberration correctors.

By determining and correcting at least one beam aberration, particularly astigmatism, before taking the image in operation 230, a more accurate energy spectrum can be retrieved from the (aberration-corrected, but dispersed) beam profile, particularly if the dispersion-caused chromatic blur contribution to the beam profile is stronger after the aberration correction than contributions caused by other beam aberrations, such as astigmatism.

In some embodiments, which can be combined with other embodiments described herein, for taking the image of the sample in operation 230, the charged particle beam imaging device may be set to a "dispersion-limited working point", which may not be optimized for obtaining high-resolution images, but may rather use a beam profile in the sample plane that allows identification of dispersion-caused chromatic blur. In particular, at a "dispersion-limited working point", the beam profile in the sample plane may be dominated by chromatic blur, and may not be dominated by other contributions, such as diffraction, spherical blur, blur caused by other beam aberrations, and/or the geometric spot size. At the dispersion-limited working point, the charged particle beam is focused by the focusing lens toward the sample such that a spot size in the sample plane is dispersion-limited, particularly such that a chromatic blur contribution to the spot size is bigger than the geometric spot size, a spherical blur contribution and/or a diffraction contribution to the spot size.

The determination of the spectrum according to embodiments described herein is beneficially conducted at a dispersion-limited working point, at which the spot size in the sample plane is mainly defined by the chromatic blur (which is related to the energy-dependent beam shift times the energy spread of the charged particle beam). Contributions of the actual geometric spot size and contributions of diffraction to the beam profile may be comparatively small at said working point. An accurate retrieval of the spectrum directly from the beam profile may hence be possible at said working point, without considering distortions/changes to the beam profile caused by diffraction and/or other beam aberrations.

In particular, the determination of the energy spectrum according to embodiments described herein may be conducted with a charged particle beam, particularly with an electron beam, that has one or more of the following parameter values: The charged particle beam may be focused on the sample with a numerical aperture (NA) of 3 mrad or more and 12 mrad or less, particularly less than 10 mrad, more particularly about 6 mrad. Detrimental aberration effects caused by a large NA can be reduced by focusing the beam with a comparatively small NA toward the sample. The charged particle beam may have a probe current in a range from 100 pA to 10 nA, particularly 1 nA to 5 nA. The charged particle beam may have a landing energy on the sample in a range from 200 eV to 10 keV. One or more beam aberrations, particularly astigmatism, of the charged particle beam may be corrected when taking the image. The image can be taken at a dispersion-limited working point of the device. The dispersion-limited working point is not necessarily suitable for taking high-resolution images of the sample, but is rather suitable for providing a beam profile that is primarily defined by the chromatic blur and is therefore beneficial for the determination of the spectrum by measurement in the sample plane.

In some embodiments, which can be combined with other embodiments described herein, the signal-to-noise ratio (SNR) of the determined energy spectrum can be improved and a more accurate energy spectrum can be provided by taking two or more images of the sample in operation 230 and by retrieving two or more beam profiles from the two or more images of the sample in operation 240, whereupon an average or mean energy spectrum of the charged particle beam is determined based on the two or more beam profiles. For example, the two or more images of the sample can be taken when the sample is arranged at two or more different positions, e.g., by movement of the sample stage and adapting the focusing strength of the focusing lens. An average of mean energy spectrum may refer to a mean energy spectrum of two or more energy spectrums determined from the two or more retrieved beam profiles. Alternatively, a mean beam profile may be calculated from the two or more retrieved beam profiles, and the energy spectrum can be determined from the mean beam profile. An average or mean energy spectrum that is based on several retrieved beam profiles may provide a higher accuracy and an improved SNR as compared to an energy spectrum that is based on the measurement of a single image.

Figure 4:
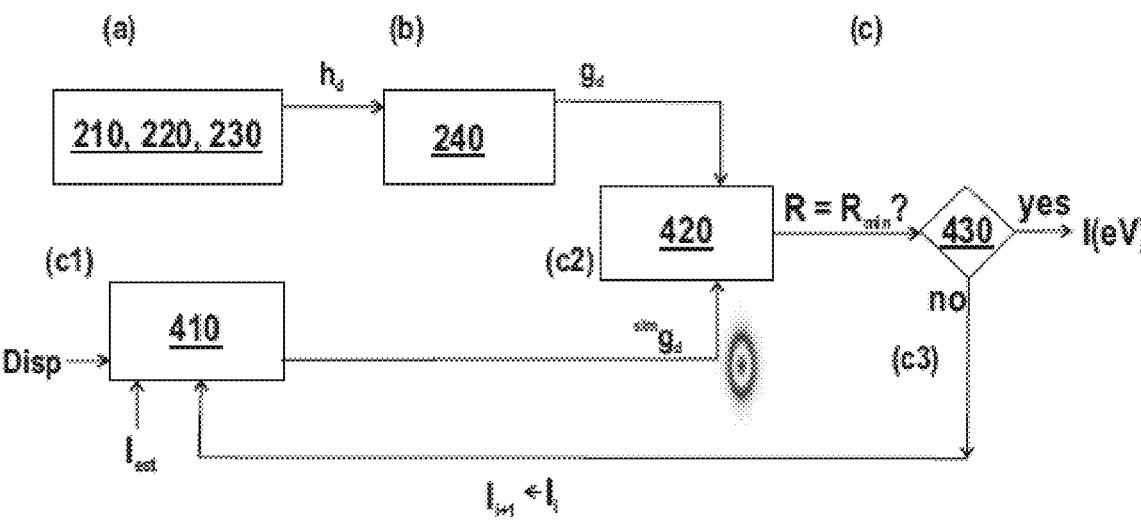
FIG. 4 is a schematic flow diagram illustrating a method of determining an energy spectrum of a charged particle beam according to some embodiments described herein.

FIG. 4 is a schematic flow diagram illustrating a method of determining an energy spectrum of a charged particle beam according to some embodiments described herein. Operations 210 to 240 may correspond to the respective operations shown in FIG. 2, such that reference can be made to the above explanations, which are not repeated here.

In particular, dispersion may be introduced in the charged particle beam imaging device that causes a spot broadening along a dispersion axis in the sample plane in operation 210. One or more beam aberrations, particularly astigmatism, may be corrected in operation 220. At least one image of the sample may be taken using the dispersed charged particle beam in operation 230. At least one beam profile may be retrieved from the image in operation 240, particularly based on a deconvolution as described above.

In some embodiments, which can be combined with other embodiments described herein, the energy spectrum is determined from the at least one beam profile by a fitting process. In particular, an estimated energy spectrum of the charged particle beam may be varied until a beam profile or an image simulated using the estimated spectrum corresponds sufficiently well with the taken image or with the beam profile retrieved therefrom.

In further detail, the energy spectrum can, for example, be determined in a fitting process as follows: In operation 410 of FIG. 4 (=operation "(c1)"), a beam profile of the charged particle beam in the sample plane may be simulated based on at least the energy-dependent deflection (i.e., based on the introduced dispersion (Disp)) and based on an estimated energy spectrum $(I_{est})$ of the charged particle beam to provide a simulated beam profile $(^{sim}g_d)$. One or more further input parameters can optionally be used for simulating the simulated beam profile $(^{sim}g_d)$, including, for example, known or determined aberrations of the charged particle beam, the numerical aperture provided by the focusing lens, the landing energy and/or the probe current of the charged particle beam. The simulation of the simulated beam profile can be carried out, e.g., based on a wave-optical simulation of a beam cross section. The estimated energy spectrum may be a rough estimation of the energy spectrum of the charged particle beam, e.g., based on an approximate main energy of the beam and based on a typical energy width.

In operation 420 of FIG. 4 (=operation "(c2)"), the simulated beam profile $(^{sim}g_d)$ may be compared to the beam profile $(g_d)$ retrieved in operation 240 for determining a magnitude (R) of a difference therebetween.

In operation 430 of FIG. 4 (=operation "(c3)"), the estimated energy spectrum is varied to provide an updated energy spectrum $(I_i \rightarrow I_{i+1})$, and operations (c1) and (c2) are repeated using the updated energy spectrum instead of the initially used estimated energy spectrum, etc., in an iterative process, for minimizing the magnitude (R) of the difference between the simulated beam profile $(^{sim}g_d)$ and the beam profile $(g_d)$ retrieved from the taken image, particularly until the magnitude (R) is below a threshold value.

Operations (c1) and (c2) may be repeated until a minimized magnitude (R) of the difference between the simulated beam profile $(^{sim}g_d)$ and the beam profile $(g_d)$ is obtained, and the updated energy spectrum at said iteration can be determined as the actual energy spectrum (I(eV)) of the charged particle beam.

For example, a quadratic difference between the simulated beam profile and the beam profile retrieved from the taken image may be minimized in an iterative process or in a fitting process (varying the energy spectrum used for the respective simulation), until the minimum of the difference therebetween is obtained, particularly until the difference is smaller than a predetermined threshold, and the energy spectrum that was used for obtaining said difference is determined as the energy spectrum of the charged particle beam.

The fitting process illustrated in FIG. 4 may lead to a more accurate energy spectrum as compared to the simpler process of taking the radial line profile along the dispersion axis that is illustrated in FIG. 3B, because contributions to the spot size such as the geometric spot size or blur contributions caused by other beam aberrations can be considered in the simulation. However, the fitting process is more complex and may take more calculation time, such that both processes have respective advantages.

The methods of determining the energy spectrum or the energy width of a charged particle beam as described herein can be carried out by a charged particle beam imaging device, e.g. as exemplarily depicted in FIG. 1, that includes a charged particle source 105 for emitting the charged particle beam 11 propagating along an optical axis A, a sample stage 108, a focusing lens 120 for focusing the charged particle beam toward a sample 10 placed on the sample stage 108, a charged particle detector 118 for detecting signal particles emitted from the sample upon impingement of the charged particle beam, and a processor 170 and a memory storing instructed that, when executed, cause the charged particle beam imaging device to carry out operations as follows: (i) to retrieve a beam profile of the charged particle beam from an image of the sample taken when the charged particle beam is influenced by a dispersive element or mechanism; and (ii) to determine the energy spectrum of the charged particle beam from the beam profile.

The dispersive mechanism or element may introduce an energy-dependent deflection on the charged particle beam that causes a spot broadening in the sample plane along a dispersion axis.

The dispersive mechanism or element may include a beam deflector 107, e.g., arranged upstream of the focusing lens, that introduces an energy-dependent deflection of the charged particle beam. For example, the beam deflector 107 may be configured to cause an off-axis (or tilted) beam path of the charged particle beam through the focusing lens 120. Other dispersive elements or mechanisms can be considered, such as electrostatic or magnetic multipoles, aberration correctors (that can be usable for causing an energy-dependent deflection), prisms, energy filters, beam alignment or beam steering elements and others.

In some embodiments, the instructions, when executed by the processor, cause the extraction of at least a (first) radial line profile along the dispersion axis from the beam profile and a determination of the energy spectrum based on at least the first radial line profile. The instruction may further cause a conversion of a distance along the dispersion axis to energy units. Optionally, a (second) radial line profile along a second axis transverse to the dispersion axis, particularly orthogonal thereto, may be extracted from the retrieved beam profile, and the energy spectrum may be calculated using the first and the second radial line profiles, e.g., based on a deconvolution. Alternatively or additionally, the instructions may cause the execution of a fitting routine as described herein for determining the energy spectrum and/or the energy width of the charged particle beam in an iterative process.

In some embodiments, the charged particle beam imaging device further includes at least one or more beam aberration correctors from the group consisting of a stigmator, a quadrupole corrector, an electrostatic multipole corrector, and a magnetic multipole corrector. The one or more beam aberrations correctors can be used for correcting one or more beam aberrations, particularly including astigmatism, in particular astigmatism introduced by the dispersive element or mechanism.

In particular, the instructions, when executed by the processor, may cause a determination of an amount of astigmatism of the charged particle beam influenced by the dispersive element or mechanism and a correction of said amount with the at least one or more beam aberration correctors. In particular, the value of the beam aberration coefficient that describes the astigmatism of the charged particle beam can be determined, and the astigmatism can be corrected for enabling a more accurate determination of the energy spectrum.

In some embodiments, which can be combined with other embodiments described herein, the memory stores a dependency between at least one beam aberration and an aberration characteristic, wherein the aberration characteristic is a parameter that has a predetermined relation to the at least one beam aberration and is extractable from one or more defocus beam profiles.

The instructions, when executed by the processor, may further cause the charged particle beam imaging device to retrieve one or more defocus beam profiles from one or more defocus images taken at one or more defocus settings; to extract a retrieved value of the aberration characteristic from the one or more defocus beam profiles; and to determine an actual amount of the at least one beam aberration based on the above dependency stored in the memory and based on the retrieved value of the aberration characteristic.

The actual amount of the at least one beam aberration, particularly the actual amount of astigmatism, can be provided to the one or more beam aberration correctors for at least partially correcting the at least one beam aberration.

While the foregoing is directed to embodiments, other and further embodiments may be devised without departing from the basic scope thereof, and the scope thereof is determined by the claims that follow.

What is claimed:

1. A method of determining an energy spectrum or energy width of a charged particle beam focused by a focusing lens toward a sample plane, comprising:
   (a) introducing an energy-dependent deflection of the charged particle beam that leads to a spot broadening along a dispersion axis in the sample plane, and taking an image of a sample arranged in the sample plane using the charged particle beam;
   (b) retrieving a beam profile of the charged particle beam from the image; and
   (c) determining the energy spectrum or energy width from the beam profile.

2. The method of claim 1, wherein determining the energy spectrum from the beam profile comprises taking a radial line profile through the beam profile along the dispersion axis and converting a deflection distance along the dispersion axis to energy units.

3. The method of claim 1, wherein determining the energy spectrum from the beam profile comprises:
   taking a first radial line profile through the beam profile along the dispersion axis and taking a second radial line profile along a second axis transverse to the dispersion axis; and
   calculating the energy spectrum based on the first radial line profile and the second radial line profile, particularly by deconvolving the first radial line profile using the second radial line profile.

4. The method of claim 1, wherein the energy-dependent deflection is introduced by steering the charged particle beam off-axially through the focusing lens with a beam deflector.

5. The method of claim 1, further comprising correcting at least one beam aberration of the charged particle beam after introducing the energy-dependent deflection and before taking the image.

6. The method of claim 5, wherein the at least one beam aberration is astigmatism.

7. The method of claim 5, wherein an actual amount of the at least one beam aberration is determined as follows:
   (x1) taking one or more defocus images of the sample at one or more defocus settings and retrieving one or more defocus beam profiles from the one or more defocus images;

(x2) extracting a retrieved value of at least one aberration characteristic that is related to the at least one beam aberration from the one or more defocus beam profiles; and (x3) determining the actual amount of the at least one beam aberration based on the retrieved value of the aberration characteristic and based on a predetermined dependency between the at least one beam aberration and the at least one beam aberration characteristic.

8. The method of claim 7, wherein, in (x1), the one or more defocus images of the sample are taken when the sample is arranged at one or more defocus distances from a beam focus of the charged particle beam.

9. The method according to claim 1, wherein the energy spectrum is determined as follows:

(c1) simulating a beam profile of the charged particle beam in the sample plane based on at least the energy-dependent deflection and based on an estimated energy spectrum of the charged particle beam to provide a simulated beam profile;

(c1) comparing the simulated beam profile with the beam profile retrieved in (b) for determining a magnitude of a difference therebetween; and (c3) varying the estimated energy spectrum to provide an updated energy spectrum, and repeating (c1) and (c2) in an iterative process for minimizing said magnitude.

10. The method according to claim 9, wherein (c1) and (c2) are repeated until a minimized magnitude of the difference between the simulated beam profile and the beam profile retrieved in (b) is obtained, and the updated energy spectrum at said iteration is determined as the energy spectrum of the charged particle beam.

11. The method according to claim 1, wherein the charged particle beam used for taking the image of the sample in (a) is an electron beam that has one or more of the following parameter values:

the electron beam is focused on the sample with a numerical aperture of 3 mrad or more and 12 mrad or less;

a probe current of the electron beam is in a range from 100 pA to 10 nA; and a landing energy of the electron beam is in a range from 200 eV to 10 keV.

12. The method according to claim 1, wherein, in (b), the beam profile is retrieved from the image by deconvolving the image with a high-resolution image of the sample, or wherein retrieving the beam profile from the image in (b) comprises dividing the image in Fourier space by a high-resolution image of the sample in Fourier space.

13. The method according to claim 1, wherein, for taking the image of the sample in (a), the charged particle beam is focused by the focusing lens toward the sample such that a spot size in the sample plane is dispersion-limited, particularly such that a chromatic blur contribution to the spot size is bigger than a geometric spot size, a spherical blur contribution and a diffraction contribution.

14. The method according to claim 1, wherein, in (a), two or more images of the sample are taken when the sample is arranged at two or more different positions;

in (b), two or more beam profiles are retrieved from the two or more images of the sample; and in (c), an average or mean energy spectrum is determined from the two or more beam profiles.

15. The method according to claim 1, further comprising:

changing at least one of operating conditions and settings of one or more beam-optical components based on the energy spectrum for modifying or tailoring the energy spectrum.

16. A charged particle beam imaging device configured to determine an energy spectrum or energy width of a charged particle beam, comprising:

a source for emitting the charged particle beam propagating along an optical axis;

a sample stage;

a focusing lens for focusing the charged particle beam on a sample placed on the sample stage, wherein a dispersive element or mechanism is provided for introducing an energy-dependent deflection of the charged particle beam that leads to a spot broadening along a dispersion axis in a sample plane;

a charged particle detector for detecting signal particles emitted from the sample; and a processor and a memory storing instructions that, when executed by the processor, cause the charged particle beam imaging device to retrieve a beam profile of the charged particle beam from an image of the sample taken when the charged particle beam is influenced by the dispersive element or mechanism; and to determine the energy spectrum or energy width of the charged particle beam from the beam profile.

17. The charged particle beam imaging device of claim 16, wherein the dispersive element or mechanism comprises a beam deflector configured to provide an off-axis or tilted beam path through the focusing lens.

18. The charged particle beam imaging device of claim 16, wherein the instructions, when executed by the processor, cause an extraction of at least a first radial line profile along the dispersion axis from the beam profile and a determination of the energy spectrum based on at least the first radial line profile.

19. The charged particle beam imaging device of claim 16, further comprising at least one or more beam aberration correctors from the group consisting of a stigmator, a quadrupole corrector, an electrostatic multipole corrector, and a magnetic multipole corrector.

20. The charged particle beam imaging device of claim 19, wherein the instructions, when executed by the processor, cause a determination of an amount of astigmatism of the charged particle beam influenced by the dispersive element or mechanism, and a correction of said amount with the at least one or more beam aberration correctors.

* * * * *